United States Patent
Richter et al.

(10) Patent No.: US 6,388,450 B2
(45) Date of Patent: May 14, 2002

(54) METHOD FOR DETERMINING THE STATE OF CHARGE OF STORAGE BATTERIES

(75) Inventors: Gerolf Richter, Hildesheim; Eberhard Meissner, Wunstorf, both of (DE)

(73) Assignee: VB Autobatterie GmbH (DE)

( * ) Notice: Subject to any disclaimer, the term of this patent is extended or adjusted under 35 U.S.C. 154(b) by 0 days.

(21) Appl. No.: 09/737,311

(22) Filed: Dec. 15, 2000

(30) Foreign Application Priority Data

Jan. 21, 2000 (DE) ......................................... 100 02 473

(51) Int. Cl.⁷ ............................................. G01N 27/416
(52) U.S. Cl. ........................................ 324/427; 324/426
(58) Field of Search ................................. 324/427, 428, 324/431, 433, 426, 432; 320/132, 134, 136

(56) References Cited

U.S. PATENT DOCUMENTS

| | | | | |
|---|---|---|---|---|
| 5,321,627 A | * | 6/1994 | Reher | .......................... 324/427 |
| 5,761,072 A | * | 6/1998 | Bardsley, Jr. et al. | ........ 324/427 |
| 6,127,806 A | * | 10/2000 | Tanjo et al. | ................. 320/132 |

* cited by examiner

Primary Examiner—Peter S. Wong
Assistant Examiner—Lawrence Luk
(74) Attorney, Agent, or Firm—Schnader Harrison Segal & Lewis LLP

(57) ABSTRACT

A method for determining the state of charge of a storage battery, wherein at least two methods of different approach for determining state of charge are simultaneously applied. The individually obtained results of the different methods are weighted in accordance with their respective reliability in the respective current or former operating situation of the storage battery, and the weighted mean value of the individual methods thus obtained is used as final output variable of the method and displayed. The voltage of the storage battery, the current flowing through it and its temperatures are measured, and the different methods use these input variables and variables derived from these input variables as final input variables. At least one of the different methods uses the integration of the current flowing through the storage battery to determine the changes in the charge content of the storage battery. At least one other of the different methods uses a mathematical model which is implemented on an electronic computer and simulates the behavior of the storage battery.

14 Claims, No Drawings

METHOD FOR DETERMINING THE STATE OF CHARGE OF STORAGE BATTERIES

SUMMARY OF THE INVENTION

This invention relates to storage batteries, particularly to methods of determining the state of charge of such batteries.

BACKGROUND

It is necessary or at least highly advantageous in many applications to determine the current state of charge (SOC) of a storage battery. At first, efforts in this regard concentrated on measuring and evaluating the changes in electrolyte density, either directly by mechanical and optical methods, or indirectly via the open-circuit voltage of the battery, or the individual cells, coupled to the acid density.

With advancing progress in the field of electronic data acquisition and processing, methods of charge balancing using electricity meters have come to the fore. These methods exhibit very good success in the case of batteries that are subjected to complete charging and discharging with only rare intermediate chargings. Errors can arise from inaccuracies in measurement and computation, parasitic charge losses in the storage battery, the aging of the battery and extractable battery capacities changing with the level of the charging or discharging current. However, it has not heretofore been possible with the aid of such integrating methods to make a reliable statement on the current performance readiness (the product of current times voltage) of the battery, since, for example, the change in the internal resistance is a function of the complete or partial cycles preceding with regard to time interval and current level.

A number of the weak points mentioned in the charge balancing method can be partially overcome by forming mathematical models of the battery. Methods using mathematical models (descriptive equations or mathematically representable equivalent circuit diagrams), which are evaluated on electronic computers with stipulation of a set of battery-typical basic data or equivalent circuit diagram components, make it possible to detect the state of charge of the battery operating simultaneously in parallel with the model. A limiting factor of these methods is not only the quality of the basic model, but the quality of the input parameters with regard to their correspondence to the battery under consideration.

Balancing the output voltage calculated via the model with the actual battery voltage under the conditions of identical temperature and identical current throughput has proved to be particularly useful as an evaluation method. This type of evaluation also permits estimation of the aging processes in the storage battery.

Representative disadvantages of methods based on mathematical models include an enormous rise in model complexity, particularly when the aim is to calculate the effects of short-term changes in charge and when large quantities of charge are also picked up by or discharged from the batteries over relatively long time intervals.

The problem is in that the most varied charging or discharging conditions are possible for the starter battery, depending on the motor vehicle cycles, distributed statistically with regard to duration and speed profile, on which there are likewise superimposed statistically distributed power consumption profiles of the electric consumers installed in the automobile, and must be detected by the state of charge determining unit.

It would, therefore, be highly advantageous to provide a method for determining the state of charge of a storage battery which detects large exchanges of charge in relation to the battery capacity, rest periods and standby phases, as well as battery aging.

SUMMARY OF THE INVENTION

The invention is direct to a method for determining the state of charge of a storage battery comprising simultaneously applying at least two methods having different steps to determining state of charge of the battery; weighting individually obtained results of the different methods based on their respective reliability in the respective current or former operating situation of the storage battery; and determining a weighted mean value of the individual methods thus obtained as a final output variable.

DETAILED DESCRIPTION OF THE INVENTION

The following description is intended to refer to specific embodiments of the invention described herein and is not intended to define or limit the invention, other than in the appended claims. Also, the drawing is not to scale and various dimensions and proportions are contemplated.

According to the invention, a plurality of methods of different approach and/or containing different steps for determining state of charge are simultaneously applied, the individually obtained results of these different methods are weighted in accordance with their respective reliability during the respective current or former operating situation of the storage battery, and the weighted mean value of the individual methods thus obtained is used as a final output variable of the method and displayed. For example, the charge balancing method, which operates in the short term region and relatively precisely given very large currents, is combined with other methods for the long term region, in particular, with methods based on mathematical models.

It is also possible to detect rest periods and standby phases and battery aging by means of this mode of procedure. A further advantage consists in that plausibility monitoring of the results by means of two different methods of determination is possible.

In particular, the invention is defined by virtue of the fact that the voltage of the storage battery, the current flowing through it and its temperature are measured, and that the different methods use these input variables and variables derived from these input variables as final input variables. In this case, at least one of the methods used is an integrating method, and at least one other method is a model-based method.

Hereinafter, an "integrated" or "integrating" method is understood to be a measurement of the current of the storage battery by means of an electronic module, and the formation, implemented in analog and digital fashion, of the current time integral $\int i\, dt$, as a result of which the change in the state of charge of the storage battery is inferred.

Hereinafter, a "model-based" or "model" method is understood as a simulation of battery behavior in an electronic equivalent circuit diagram, and the mathematical version thereof in a digital circuit. In this case, for example, the parameter variables of the model and the state variables of the model are matched by comparing the behavior of model and real storage battery using a control engineering approach, and the state of charge of the storage battery is thus inferred.

By integrating the current flowing through the storage battery, the changes in the charge content of the storage battery are determined from which changes in the state of charge are inferred. At least one other of the various methods uses a mathematical model implemented on an electronic computer, which simulates the behavior of the storage battery, in which case, for example, but not necessarily, a comparison of the behavior of model and real storage battery is used via a control engineering approach to match the parameter variables of the model and the state variables of the model and, thus, to infer the state of charge of the storage battery.

Additionally, at least one of the methods used may be employed to infer the service age of the storage battery or the necessity to exchange the latter, the current or future efficiency or the current or future availability of the storage battery, or such an inference on the availability of the storage battery is performed by combining the statements of a plurality of the methods used, in which case, if appropriate, a weighted mean of the availability statements thus obtained for the individual methods is used as (further) final output variable of the method.

Thus, according to the invention, at least two different methods with different strengths and weaknesses can be combined in such a way that in each operating situation at least one of them is sufficiently reliable with regard to the state of charge, possibly also in connection with the state of charge determined at an earlier instant. Another one of the various methods can be used depending on the operating situation. In a general case, a weighted mean of the states of charge determined by the various methods is formed.

Calculation of the weighting factors for the results of the various methods is performed as a function of the operating conditions, in particular, of the time characteristics of voltage, current and temperature of the storage battery. Furthermore, it is also possible to provide details on the characteristic maps of a battery and parameters for calculating the weighting role.

In particular, it is also possible to use methods which supply informative results only in the case of specific operating states, and are more strongly affected by errors in the case of other operating states. A weighting function between the various methods ensures that the values determined by informative methods feature strongly in the end result of the method according to the invention, while the values determined by methods more strongly affected by errors under the given operating states feature only slightly.

The state of charge value continuously obtained using this method, or another function of the state of charge values obtained within the framework of the method according to the various methods used, or their absolute values, relative magnitude, their change or rate of change is displayed and/or used to control a function in the system connected to the storage battery. In particular, these values are used to control the electric energies in a motor vehicle, and the state of charge value serves as an important decision aid for this control.

The input measured values used for the application of the method are determined in sampling intervals T1 (for example, from about 1 ms to about 1 s) between two measuring operations, for example, for the battery current and the battery voltage associated therewith.

A computing interval of duration Ti fixes the time interval between the determination of two state of charge values SOC(k) and/or the change in the state of charge ΔSOC(k) after each of the various methods k=1, 2, 3 . . .

The methods based on mathematical models run without interruption, as it were in accompaniment to the battery, possibly with a change in the parameters of the component of the equivalent circuit diagram on the basis of aging. The changes in the state of charge values ΔSOCi(k) are determined in a computing interval Ti using the various methods k=1, 2, 3 . . . The change in the state of charge ΔSOCi obtained using the method according to the invention is produced from this as a weighted mean:

$$\Delta SOCi = \alpha(1)*\Delta SOCi(1) + \alpha(2)*\Delta SOCi(2) + \alpha(3)*\Delta SOCi(3) + \ldots$$

The weighted factors β(k) of all simultaneously used methods sum to the value "1".

A new state of charge SOCi is calculated from the state of charge $SOC_{i-1}$ at the end of the preceding computing interval Ti-1 and the change in the state of charge ΔSOCi during the computing interval Ti. This new state of charge value SOCi flows into the model-based methods which iteratively approximate the true state of charge value by comparison with the measured values. Consequently, in the case of large deviations of SOCi from the state of charge value of the model-based method this deviation is particularly taken into account in each case and corrected for determining ΔSOCi+1.

States of charge SOCi(k) assigned to the various methods can be calculated from the changes in the state of charge values ΔSOCi(k). The state of charge SOCi obtained using the method according to the invention is produced as a weighted mean:

$$SOCi = \beta(1)*SOCi + \beta(2)*SOCi(2) + \beta(3)*SOCi(3) + \ldots$$

The weighting factors β(k) of methods simultaneously used sum to the value "1". This new state of charge value SOCi flows into the model-based methods.

The weighting factors α(k) of the state of charge changes ΔSOCi(k) determined using the various methods k=1, 2, 3 . . . are chosen to be large (in particular, in their sum=1 in the case of a current =0) in computing time intervals Ti in which a small current was flowing at each individual instant in the case of methods based on mathematical models, and chosen to be small (in particular, in their sum=0 in the case of a current=0) in the case of methods based on current integration. Account is thereby taken of the slight reliability of the methods based on current integration in the case of small flowing currents.

The weighting factors α(k) of the state of charge changes ΔSOCi(k) determined using the various methods k=1, 2, 3 . . . are chosen to be small (in particular, in their sum=0 in the case of a state of charge change=0) in computing time intervals Ti in which a large current was flowing but the change in the state of charge is only slight in the case of methods based on mathematical models, and chosen to be large (in particular, in their sum=1 in the case of a state of charge change=0) in the case of methods based on current integration. The low reliability of the first method is thereby taken into account in the case of small state of charge changes.

A current is relatively small in this case when it leads to a state of charge change of no more than about 1%, and advantageously no more than about 0.2%, of the nominal capacity of the storage battery per hour. A current is relatively large when it leads to a state of charge change of more than about 10%, and advantageously more than about 20%, of the nominal capacity of the storage battery per hour.

A state of charge is relatively small when it is no more than about 1%, and advantageously no more than about 0.2% of the nominal capacity of the storage battery per hour. A state of charge change is relatively large when it is more than about 10%, and advantageously more than about 20%, of the nominal capacity of the storage battery per hour.

The weighting factors $\alpha(k)$ of the state of charge changes $\Delta SOCi(k)$ determined using the various methods are chosen with the same order of magnitude in computing time intervals Ti in which a substantial change occurred in the state of charge in the case of methods based on mathematical models and in the case of methods based on current integration.

The weighting factors $\alpha(k)$ of the state of charge changes $\Delta SOCi(k)$ determined using current integration methods are set equal to 1 in computing time intervals Ti in which the methods based on mathematical models represent an inaccurate description of the battery (frequently in areas with a strong positive charge balance).

The weighting factors $\alpha(k)$ of the state of charge changes $\Delta SOCi(k)$ determined using the various methods k=1, 2, 3 . . . are determined in computing time intervals Ti in which none of the preconditions described in the above-named examples obtain by interpolation between these cases. This interpolation can be performed linearly or with another functional relationship.

The following values are used as corner points of the interpolation as regards the flowing current and the converted charge quantity:

A current is relatively small in this case when it is no more than about 1%, and advantageously no more than about 0.2%, of the nominal capacity of the storage battery per hour. A current is relatively large when it leads to a state of charge change of more than about 10%, and advantageously more than about 20%, in the nominal capacity of the storage battery per hour. A state of charge change is relatively small when it is no more than about 1%, and advantageously no more than about 0.2%, of the nominal capacity of the storage battery per hour. A state of charge change is relatively large when it is more than about 10%, and advantageously more than about 20%, of the nominal capacity of the storage battery per hour.

Each of the simultaneously applied methods k can evaluate its own current reliability and prescribe a proposed value for the weighting factor $\alpha(k)$ or $\beta(k)$ from the value range from 0 to 1. The point is that each of the methods can derive from the values of their input variables and the history of their own value determination, whether, under the operating conditions currently obtained, they can make a more or less significant statement relating to the state of charge and its change. The method normalizes these proposed values such that their sum is 1 and then calculates a change in the state of charge or a state of charge.

The evaluation or application of the state of charge determined using the combined methods described permits reliable and economic operation of a motor vehicle. The actual reliability of a method k depends (1) on the type of the method (current integrating, model based, etc. . . . ), (2) on the actual battery operating conditions (high/low current i, high/low current change rates with time di/dt, high/low state of charge change rates with time dSOC/dt, etc. . . . ) and (3) on the precision of sensing of the input values (voltage, current, temperature, . . . ).

It is known that current integration gives a reasonably good estimation of flow charge if the current is not too low. Otherwise, the precision of current sensing (sensing error delta i) is not small compared with the current value i itself. Furthermore, the current integration gives a reasonable good estimation of flow charge if the period of measurement is not too long, as the integrating error increases with time. On the other hand, model based algorithms may be better, the more dynamic the operating conditions are, i.e., the more changes of the input values current, voltage, etc., take place. The more that "happens", the more the algorithm may "learn" about the battery status. This is true if sensing is fast enough to follow these changes. If the change rate exceeds the capability of sensing, the reliability will decline. As the different input values will be used within different models in a different way, error tracing calculation will give different consequences of sensing errors on the results of different models.

Therefore, for any model an algorithm may calculate a relative reliability of the very model under the actual operating conditions with given sensing precision, taking into account as well the type of model as the very error tracing calculation.

If the current state of charge SOC undershoots a prescribed threshold S1, a display (alarm function) is produced, or a measure is initiated, for example, the consumer load is reduced or the charging power fed to the storage battery is increased.

If the current state of charge SOC overshoots a prescribed threshold S2, a display (alarm function) is produced, or a measure is initiated, for example, the consumer load is increased or the charging power fed to the storage battery is reduced.

If the deviation of the states of charge determined by the various methods, or the deviation of the state of charge changes determined in a time interval overshoots a prescribed threshold S3, a display or a measure is initiated on the basis of this excessively high derivation between the results according to the various methods.

If the deviation of the states of charge determined by the various methods, or the deviation of the state of charge changes determined in a time interval once again undershoots a prescribed threshold S4, the previously initiated measure is canceled again.

What is claimed is:

1. A method for determining the state of charge of a storage battery comprising:

substantially simultaneously applying at least two methods having different steps to determine the state of charge of the battery, wherein at least one of the different methods uses integration of current flowing through the storage battery to determine changes in charge content of the storage battery, from which changes in the state of charge are determined, and wherein at least one other of the different methods uses a mathematical model that simulates behavior of the storage battery;

weighting individually obtained results of the different methods based on their respective reliability in the respective current or former operating situation of the storage battery; and determining a weighted mean value of the individual methods thus obtained as a final variable.

2. The method as claimed in claim 1, wherein voltage, current and temperature of the storage battery are measured as input variables, and wherein the different methods use said input variables and variables derived from said input variables as final input variables.

3. The method as claimed in claim 1, wherein at least one of the methods used is employed to determine at least one of 1) service age of the storage battery or a need to replace it, 2) current or future efficiency or 3) current or future availability of the storage battery.

4. The method as claimed in claim 1, wherein change, obtained in a computing interval Ti, in the state of charge ΔSOCi is calculated as a weighted mean of the state of charge changes ΔSOCi(k) determined using the methods:

$$\Delta SOCi=\alpha(1)*\Delta SOCi(1)+\alpha(2)*\Delta SOCi(2)+\alpha(3)*\alpha SOCi(3)+\ldots,$$

wherein weighting factors α(k) of simultaneously used methods sum to value "1", and wherein a new state of charge SOCi is calculated from state of charge SOCi-1 before interval Ti and state of charge change ΔSOCi during interval Ti, and is used as the final output variable.

5. The method as claimed in claim 1, wherein each method evaluates its own current reliability and determines a selected value for α(k) from a value range from 0 to 1, wherein the method normalizes the selected values such that their sum is 1, and wherein a change in the state of charge or a state of charge is calculated.

6. The method as claimed in claim 1, wherein the state of charge changes ΔSOCi(k) determined in a interval Ti using the methods are used to calculate state of charges SOCi(k) assigned to the methods, and a state of charge SOCi of the method is determined therefrom as a weighted mean:

$$SOCi=\beta(1)*SOCi(1)+\beta(2)*SOCi(2)+\beta(3)*SOCi(3)+\ldots,$$

wherein weighting factors β(k) of simultaneously used methods sum to value "1", and wherein a new state of charge value SOCi is used in the model-based method.

7. The method as claimed in claim 1, wherein weighting factors α(k) of the state of charge changes ΔSOCi(k) determined using the methods are selected to be:
   a) large in time intervals Ti in which at any one time a small current was flowing, in methods based on mathematical models, and small in methods based on current integration,
   b) small in computing time intervals Ti in which a large current was flowing but a change in the state of charge is only slight, in methods based on mathematical models, and large in methods based on current integration,
   c) of the same order of magnitude in computing time intervals Ti in which a substantial state of charge change occurred, in methods based on mathematical models and in methods based on current integration, and
   d) determined in computing time intervals Ti in which none of the preconditions a), b) or c) obtained by interpolation between these cases.

8. The method as claimed in claim 1, wherein the determined state of charge value or another function of the state of charge values obtained or their absolute values, relative magnitude, their change or rate of change is displayed, and used to control a function in the system connected to the storage battery.

9. The method as claimed in claim 1, further comprising displaying the final output variable.

10. A method for determining the state of charge of a storage battery comprising:
   substantially simultaneously applying at least two methods having different steps to determine the state of charge of the battery, wherein at least one of the methods used is employed to determine at least one of 1) service age of the storage battery or a need to replace it, 2) current or future efficiency or 3) current or future availability of the storage battery;
   weighting individually obtained results of the different methods based on their respective reliability in the respective current or former operating situation of the storage battery; and
   determining a weighted mean value of the individual methods thus obtained as a final output variable.

11. The method as claimed in claim 10, wherein change, obtained in a computing interval Ti, in the state of charge ΔSOCi is calculated as a weighted mean of the state of charge ΔSOCi(k) determined using the methods:

$$\Delta SOCi=\alpha(1)*\Delta SOCi(1)+\alpha(2)*\Delta SOCi(2)+\alpha(3)*\Delta SOCi(3)+\ldots,$$

wherein weighting factors α(k) of simultaneously used methods sum to value "1", and wherein a new state of charge SOCi is calculated from state of charge SOCi-1 before interval Ti and state of charge change ΔSOCi during interval Ti, and is used as the final output variable.

12. The method as claimed in claim 11, wherein the state of charge changes ΔSOCi(k) determined in a interval Ti using the methods are used to calculate state of charges SOCi(k) assigned to the methods, and a state of charge SOCi of the method is determined therefrom as a weighted mean:

$$SOCi=\beta(1)*SOCi(1)+\beta(2)*SOCi(2)+\beta(3)*SOCi(3)+\ldots,$$

wherein weighting factors β(k) of simultaneously used methods sum to value "1", and wherein a new state of charge value SOCi is used in the model-based method.

13. The new method as claimed in claim 10, wherein weighting factors α(k) of the state of charge changes ΔSOCi (k) determined using the methods are selected to be:
   a) large in time intervals Ti in which at any one time a small current was flowing, in methods based on mathematical models, and small in methods based on current integration,
   b) small in computing time intervals Ti in which a large current was flowing but a change in the state of charge is only slight, in methods based on mathematical models, and large in methods based on current integration,
   c) of the same order of magnitude in computing time intervals Ti in which a substantial state of charge change occurred, in methods based on mathematical models and in methods based on current integration, and
   d) determined in computing time intervals Ti in which none of the preconditions a), b) or c) obtained by interpolation between these cases.

14. The method as claimed in claim 11, wherein each method evaluates its own current reliability and determines a selected value for α(k) from a value range from 0 to 1, wherein the method normalizes the selected values such that their sum is 1, and wherein a change in the state of charge or a state of charge is calculated.

* * * * *